United States Patent
Adas et al.

(10) Patent No.: US 8,775,915 B2
(45) Date of Patent: Jul. 8, 2014

(54) APPARATUS AND METHOD FOR A DUAL MODE STANDARD AND LAYERED BELIEF PROPAGATION LDPC DECODER

(75) Inventors: Marwan Adas, Broadlands, VA (US); Shruti Dhingra, Germantown, MD (US); Shumin Zhang, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 195 days.

(21) Appl. No.: 13/369,038

(22) Filed: Feb. 8, 2012

(65) Prior Publication Data
US 2013/0205182 A1  Aug. 8, 2013

(51) Int. Cl.
*H03M 13/00* (2006.01)
*G06F 11/00* (2006.01)
*H03M 13/11* (2006.01)
*H03M 13/25* (2006.01)

(52) U.S. Cl.
CPC ........ *H03M 13/114* (2013.01); *H03M 13/1111* (2013.01); *H03M 13/255* (2013.01)
USPC ....................................................... 714/800

(58) Field of Classification Search
CPC .......... H03M 13/1111; H03M 13/114; H03M 13/255
USPC .................. 714/746, 755, 786, 800–801, 780
See application file for complete search history.

(56) References Cited

U.S. PATENT DOCUMENTS 8,402,341 B2 *  3/2013  Eroz et al. ...................... 714/758
8,489,957 B2 *  7/2013  Wesel et al. .................... 714/752

OTHER PUBLICATIONS

Radosavljevic et al, Multi-Rate high throughput LDPC decoder: tradeoff analysis between decoding throughput and area, 2006, CiteSeerX, pp. 1 to 5.*
Ha et al., Layered BP decoding for rate compatible punctured LDPC codes, May 2007, IEE comm. letters, vol. 11, No. 5, pp. 440-442.*
Park et al., Shuffled BP decoding for punctured LDPC codes, 2008, IEICE, pp. 1 to 5.*
Bhatt et al., Pipelined block serial decoder architecture for structured LDPC codes, 2006, IEEE, p. 225-228.*
Guo et al., A parallel layered Belief propagation decoder for non-layered LDPC codes, May 2010, Academy publisher, journal of Comm., vol. 5, No. 5, pp. 400-408.*

* cited by examiner

*Primary Examiner* — Shelly A Chase
(74) *Attorney, Agent, or Firm* — K&L Gates LLP

(57) ABSTRACT

An apparatus for a dual mode low density parity check (LDPC) decoder including edge random access memory (RAM), last-in-first-out/first-in-first-out (LIFO/FIFO) RAM, channel RAM, and parallel datapath engines, where the datapath engines include a standard belief propagation decoding (SBD) datapath and a layered belief propagation decoding (LBD) datapath, where the SBD datapath includes a shifter, an accumulator, multiplexers, and a g( )_sbd calculator, and where the LBD datapath includes the shifter, the multiplexers, and a g'( )_lbd calculator.

19 Claims, 7 Drawing Sheets

US 8,775,915 B2

APPARATUS AND METHOD FOR A DUAL MODE STANDARD AND LAYERED BELIEF PROPAGATION LDPC DECODER

BACKGROUND

Standard Belief Propagation Low Density Parity Check (LDPC) decoding and Layered Belief Propagation Low Density Parity Check decoding may be two algorithms used to perform low density parity checks, a form of forward error correction (FEC) on incoming data at, for example, a Very Small Aperture Terminal (VSAT) in a satellite communications system. Standard Belief Propagation decoding (SBD) and Layered Belief Propagation Decoding (LBD) may belong to the message passing family of algorithms. In SBD, all of the variable nodes may be updated simultaneously using previously generated check-to-variable messages, and then all of the check nodes may be updated simultaneously using previously generated variable-to-check messages. In LBD, the nodes may be updated sequentially instead of simultaneously. Sequential updating may allow for the use of the most recent values in the calculation of the next node, which may result in faster convergence.

Since LBD may converge faster than the SBD, LBD may be preferred for high data rate communication. For low data rate communication, SBD may provide better error correction performance.

BRIEF SUMMARY

It is an object of the present invention to provide an apparatus and method for a dual mode standard and layered belief propagation LDPC decoder In accordance with an aspect of the present invention, an apparatus for a dual mode low density parity check (LDPC) decoder includes edge random access memory (RAM), last-in-first-out/first-in-first-out (LIFO/FIFO) RAM, channel RAM, and parallel datapath engines, where the datapath engines include a standard belief propagation decoding (SBD) datapath and a layered belief propagation decoding (LBD) datapath, where the SBD datapath includes a shifter, an accumulator, multiplexers, and a g( )_sbd calculator, and where the LBD datapath includes the shifter, the multiplexers, and a g'( )_lbd calculator.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION

The SBD and LBD algorithms may be implemented in a single Very Large Scale Integration (VLSI) hardware module, providing support for both high and low data rate communication. This VLSI hardware module, a dual mode LDPC decoder, may be used in terminals, such as VSATs, for supporting operation with satellite communication networks based on DVB-S2 Forward channels and with networks based on extensions to DVB-S2, to allow for greater capacities and speeds. The LBD algorithm may support data rates up to 225 Mega symbols per second (Msps), and the SBD algorithm may provide better error correction performance than LBD, at a rate of 45 Msps.

The dual mode LDPC decoder may implement both SBD and LBD in part by sharing hardware resources. Hardware in the dual mode LDPC decoder may be used by both SBD and LBD, resulting in greater flexibility, less power consumption, and a smaller size than if SBD and LBD were implemented independently, for example, in two separate hardware modules.

The dual mode LDPC decoder may be in integrated into an application specific integrated circuit (ASIC) or field programmable gate array (FPGA). The ASIC or FPGA may be incorporated into a VSAT, allowing the VSAT to operate with a satellite communications network with a satellite with a Ka-band spot beam, or any other type of bent-pipe satellite.

Figure 1:
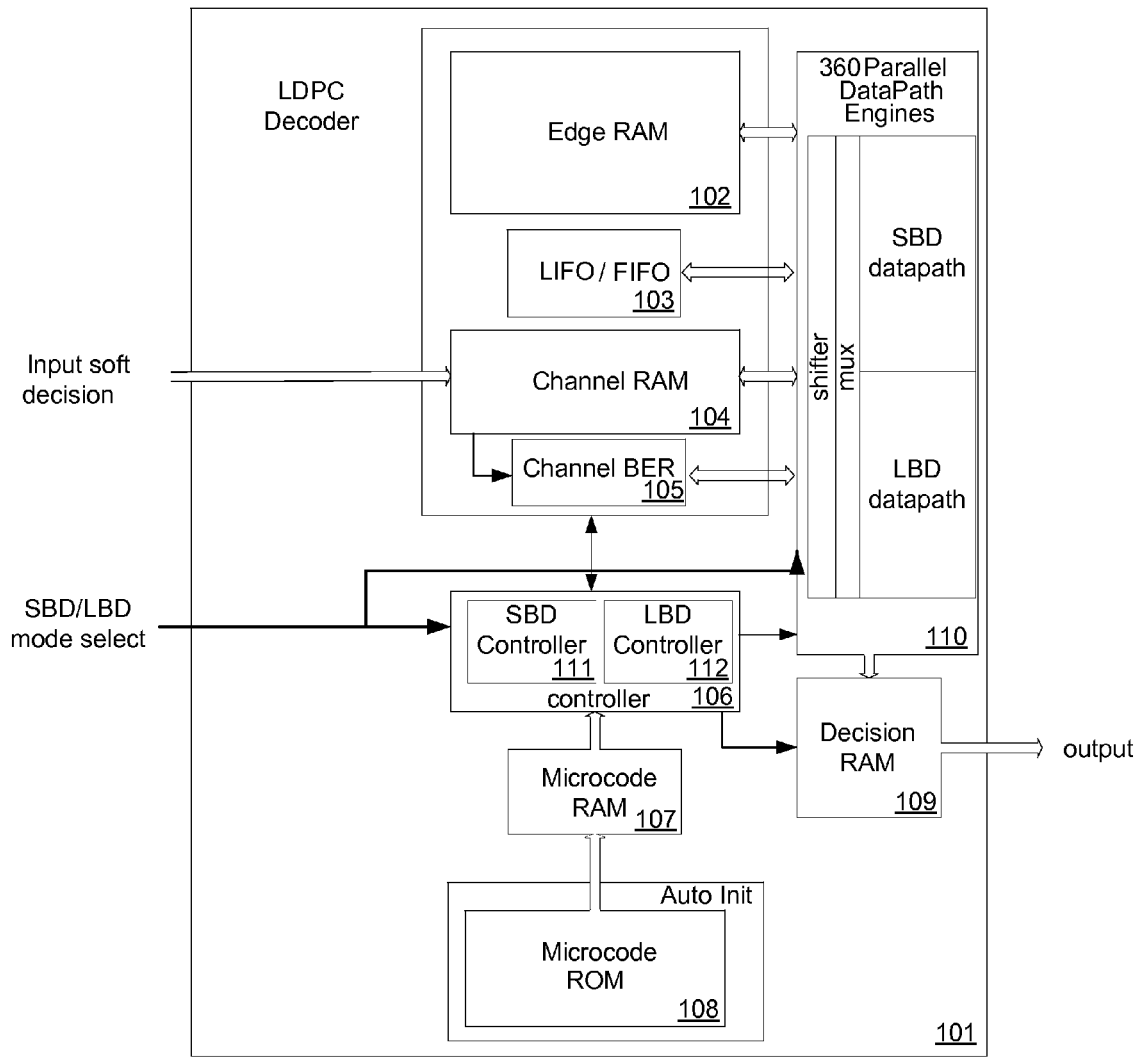
FIG. 1 depicts an exemplary architecture for a dual mode LDPC decoder.

FIG. 1 depicts an exemplary architecture for a dual mode LDPC decoder. A dual mode LDPC decoder 101 may include Edge RAM 102, LIFO/FIFO RAM 102, Channel RAM 104, Channel BER 105, a controller 106, Microcode RAM 107, Microcode ROM 108, Decision RAM 109, and 360 parallel datapath engines 110.

The dual mode LDPC decoder 101 may receive code blocks to decode into an input buffer implemented in the Channel RAM 104. The VSAT may receive data from a satellite in code blocks. These code blocks may be sent to the dual mode LDPC decoder 101 for decoding, where they may be stored in the Channel RAM 104. The Channel RAM 104 may be any suitable amount and type of memory, and may include two memory areas, on the same memory chip or separate memory chips, that operate in a ping-pong manner, so that the LDPC decoder 101 may receive the next code block to be decoded into the Channel RAM 104 while the current code block is still being decoded.

The function of the dual mode LDPC decoder 101 may be controlled by microcode stored in the Microcode ROM 108, which may be any suitable type and amount of non-volatile memory. Each type of code block may have an associated microcode stored in the Microcode ROM 108. When a code block is received at the dual mode LDPC decoder 101, the appropriate microcode may be copied from the Microcode ROM 108 into the Microcode RAM 107, which may be any suitable type and amount of volatile memory. The microcode may be used by the dual mode LDPC decoder 101 to decode the received code block. Intermediate results generated during the decoding of the code block may be stored in the Edge RAM 102, which may be any suitable type and amount of volatile memory. The results of decoding the code block may be stored in the Decision RAM 109, which may be any suitable type and amount of volatile memory.

The controller 106 may include an SBD controller 111 and an LBD controller 112. The controller 106 may receive input, the SBD/LBD mode select, that determines whether a received code block should be decoded using SBD, using the SBD controller 111, or LBD, using the LBD controller 112.

The 360 parallel datapath engines 110 on the dual mode LDPC decoder 101 may be 360 datapaths, arranged in parallel, to allow 360 bit or check node operations to be performed in parallel with SBD or LBD. Both SBD and LBD may have some algorithm specific hardware, and may share the rest of the hardware on the dual mode LDPC decoder 101. For example, SBD and LBD may share the Edge RAM 102, the Channel RAM 104, and the LIFO/FIFO RAM 103.

Figure 2:
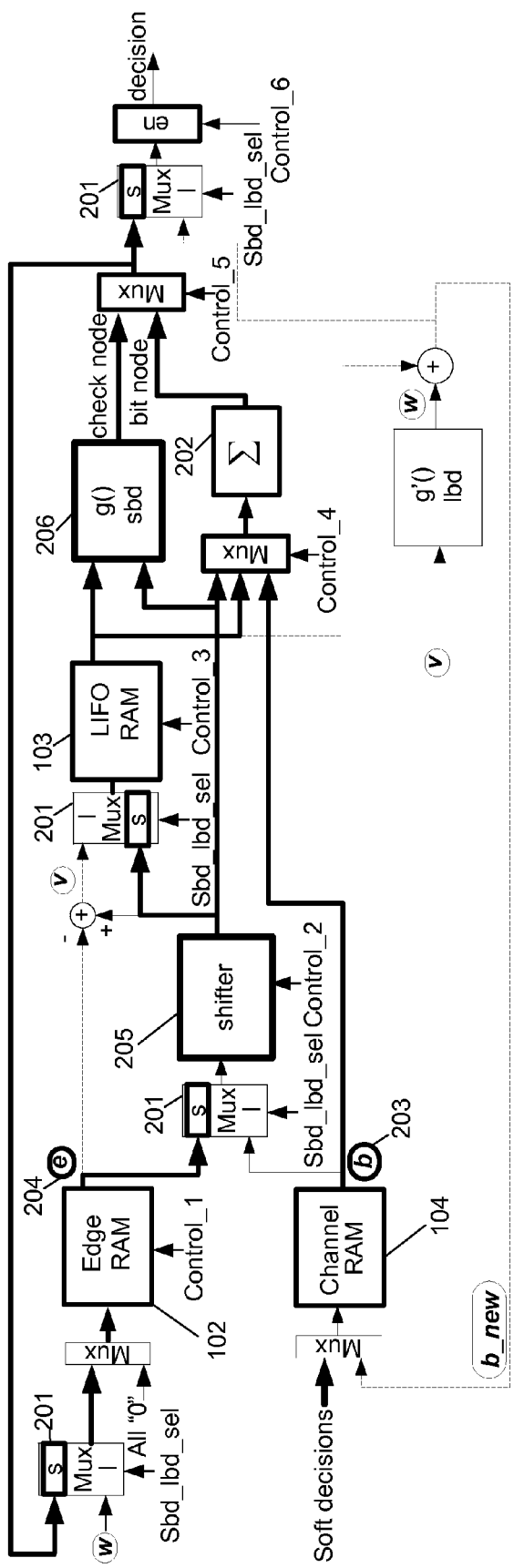
FIG. 2 depicts an exemplary datapath for standard belief propagation decoding.

FIG. 2 depicts an exemplary datapath for standard belief propagation decoding. Selection between the datapath for SBD and the datapath for LBD may be implemented using multiplexers, such as the multiplexers 201. When SBD is selected, the Sbd_lbd_sel line entering the multiplexers 201 may be set to a value indicating that the multiplexers 201 should connect the SBD input line, as indicated by the "S" in the multiplexers 201, to the output line. This may result in data entering the datapath being processed in accordance with an SBD algorithm, and may leave components of the datapath used for LBD inactive.

Figure 3:
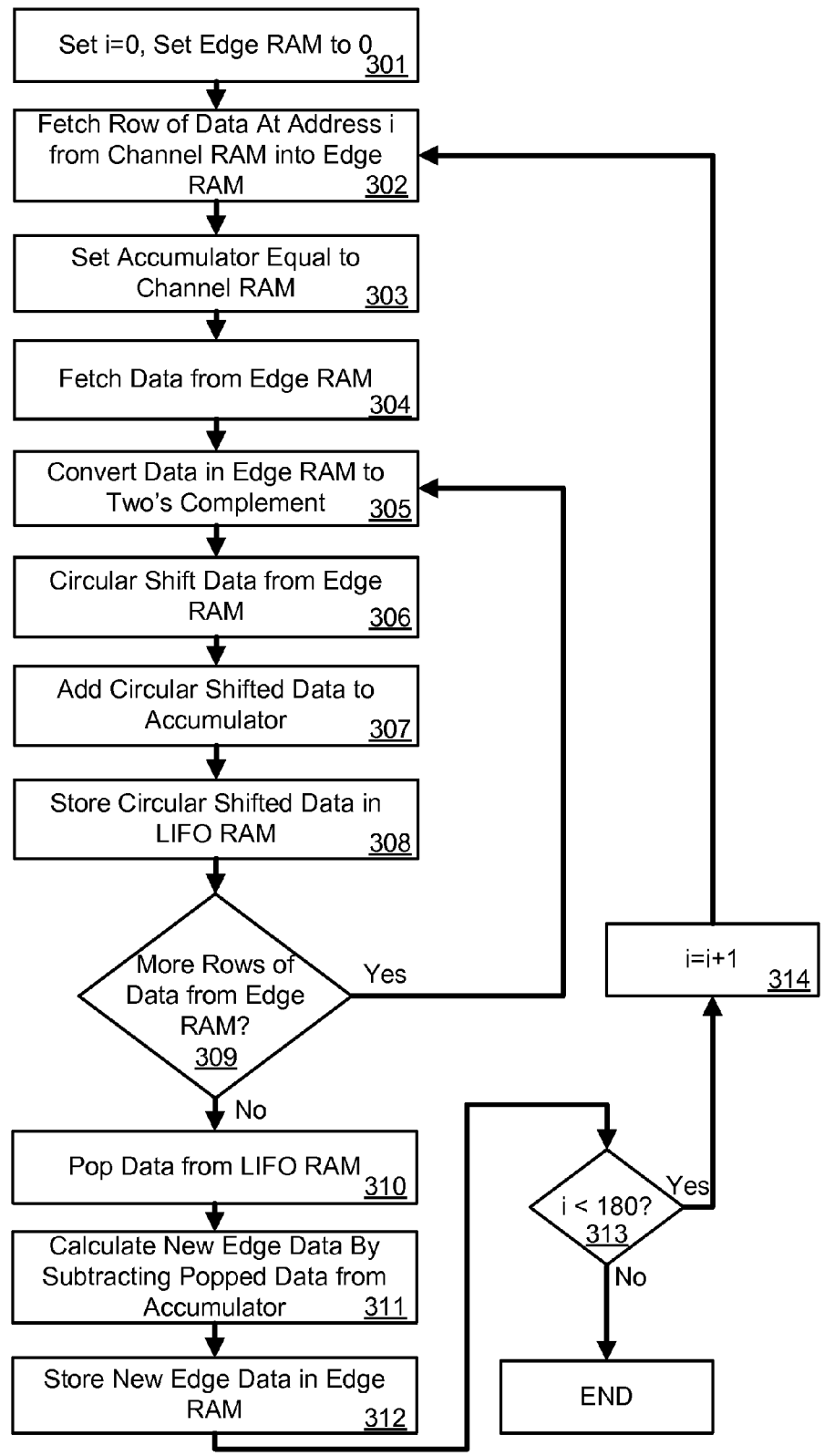
FIG. 3 depicts an exemplary procedure for standard belief propagation decoding variable node processing.

When a code block is received, the SBD/LBD mode select input to the controller 106 may result in the controller 106 setting the dual mode LDPC decoder 101 to SBD mode, where the SBD controller 111 may control the decoding of the code block. SBD may perform variable node processing, followed by check node processing, using both the shared components of the LDPC decoder 101, and certain SBD specific components. FIG. 3 depicts an exemplary procedure for standard belief propagation decoding variable node processing.

In block 301, a variable i may be set to 0, and the Edge RAM may also be set to 0. For example, the entire contents of the Edge RAM 102 may be set to 0, to remove any data leftover from previous decoding that used either SBD or LBD.

In block 302, a row of data may be fetched from the Channel RAM at the address i into the Edge RAM. For example, data from a received code block may be stored in the Channel RAM 104. A row of data from the Channel RAM 104, starting at the address indicated by the variable i, may be fetched into the Edge RAM 102. This may be the data to be decoded using SBD.

In block 303, an accumulator may be set equal to the data in the Channel RAM 104. For example, the output of the Channel RAM 104, output b 203, may be sent to an accumulator 202, which may be SBD algorithm specific hardware in the datapath of the dual mode LDPC decoder 101.

In block 304, one or more rows of data may be fetched from the Edge RAM, with the addresses of the fetched data controlled by the microcode. The microcode for the code block being decoded may be stored in the Microcode RAM 107, after being fetched from the Microcode ROM 108. Data from the code block may be fetched from the Edge RAM 102, from addresses indicated by the microcode for the code block.

In block 305, the edges of a row of the data fetched from the Edge RAM may be converted to two's complement notation. The data stored in the Edge RAM 102 may be output as output e 204. Output e 204 may be converted into two's complement notation before reaching the next multiplexer 201.

In block 306, a circular shift may be performed on the edges of the row of data among datapath slices according to a value controlled by the microcode. For example, the output e 204 from the Edge RAM 102, after being converted into two's complement notation, may enter a shifter 205. The shifter 205 may perform a circular shift on the data across all 360 datapaths in the 360 parallel datapath engines 110. The shifter 205 may be controlled by control instruction Control_2, which may be taken from the microcode in the Microcode RAM 107 for the code block being decoded.

The Edge RAM 102 may be controlled by control instruction Control_1, which may be taken from the microcode in the Microcode RAM 107 for the code block being decoded. When Control_1 is 0, the Edge RAM 102 may enter a store cycle, storing data into the Edge RAM 102 from the Channel RAM 104. When Control_1 is 1, the Edge RAM 102 may enter a fetch cycle, allowing data to be fetched from the Edge RAM 102 into the shifter 105. When Control_1 is a value other than 1 or 0, Control_1 may be used to control the addresses of the edge data.

In block 307, the row of edge data from the shifter may be added to the accumulator. For example, the accumulator 202 may already have been set to the data on output b 203 from the Channel RAM 104. The accumulator 202 may receive output data from the shifter 205, and add that to the output b 203 from the Channel RAM 104. The input to the accumulator 202 may be controlled by control instruction Control_4, which may be taken from the microcode in the Microcode RAM 107 for the code block being decoded. Control_4 may choose between add and subtract operations, or may control whether the accumulator 202 receives data from the Channel RAM 104 or the LIFO/FIFO RAM 103.

In block 308, the row of edge data may be stored in the LIFO/FIFO RAM. For example, the output from the shifter 105 may be sent to the LIFO/FIFO RAM 103 in addition to being sent to the accumulator 202. The LIFO/FIFO RAM 103, which may operate in LIFO mode when the dual mode LDPC 101 is using SBD, may store the output from the shifter 105, which may be the edge data. The LIFO/FIFO RAM 103 may be controlled by control instruction Control_3, which may be taken from the microcode in the Microcode RAM 107 for the code block being decoded. Control_3 may control the LIFO buffer of the LIFO/FIFO RAM 103, switching between push, pop, idle and pass modes.

In block 309, if there are additional rows of data that were fetched from the Edge RAM 102, flow proceeds back to block 305, which may operate on the next row of data. Otherwise, if only one row of data was fetched, or if all of the fetched rows have been processed, flow proceeds to block 310.

In block 310, one or more of the rows of edge data may be popped from the LIFO/FIFO RAM. For example, because the LIFO/FIFO RAM 103 may operate in LIFO mode for SBD, the most recent row of edge data to be stored in the LIFO/FIFO RAM 103 may be popped out.

In block 311, new edge data may be calculated by subtracting the popped edge data from the accumulator. For example, the row of edge data popped from the LIFO/FIFO 103 may be subtracted from the data stored in the accumulator 202.

In block 312, the new edge data may be stored back in the Edge RAM. For example, the new edge data, calculated by subtracting the popped edge data from the data in the accumulator 202, may be stored back in the Edge RAM 102.

In block 313, if i is less than 180, then flow proceeds to block 314, then back to block 302. Otherwise, the flow ends.

In block 314, i may be incremented, and flow proceeds back to block 302.

Figure 4:
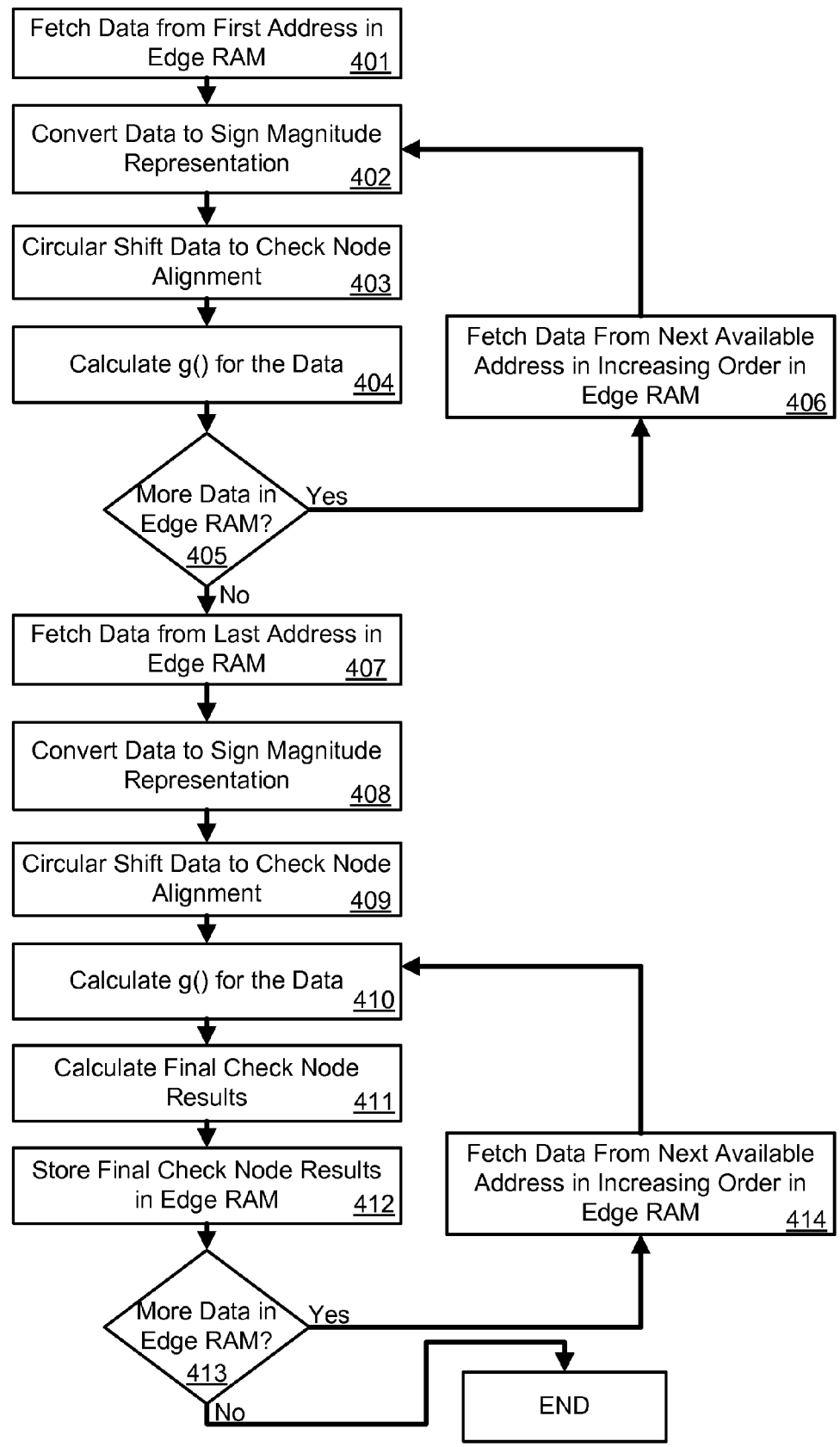
FIG. 4 depicts an exemplary procedure for standard belief propagation decoding check node processing.

FIG. 4 depicts an exemplary procedure for standard belief propagation decoding check node processing. After finishing the SBD variable node processing, for example, as in FIG. 3, the dual mode LDPC decoder 101, operating in SBD mode, may perform check node processing on the data in the Edge RAM 102 after the variable node processing. In block 401, data may be fetched from the Edge RAM. For example, data may be fetched from the Edge RAM 102, starting at the first available address in the Edge RAM 102.

In block 402, the data may be converted back to sign magnitude representation. The data in the Edge RAM 102 may be in two's complement notation after having been converted, for example, as in block 305. The data, in two's complement notation, may be converted back to sign magnitude representation.

In block 403, the data may undergo a circular shift back into check node alignment. The data may have undergone a circular shift in the shifter 205, for example, as in block 306. The data, after being converted back into sign magnitude representation, may, as output e 204, be input to the shifter 205 and be circular shifted back into check node alignment.

In block 404, g( ) may be calculated for the data using a g( ) function, and the results of the calculation may be stored in the LIFO/FIFO RAM. For example, the data output from the shifter 205 may be input into a g( )_sbd calculator 206. The g( )_sbd calculator 206 may be a hardware implementation of the g( ) function for SBD, which may determine the sign of the final decision, and the minimum absolute value of the magnitude of the final decision. The g( ) function may be, for example, $g(a,b)=\text{sign}(a)\times\text{sign}(b)\times\{\min(|a|,|b|)\}$. The results of the g( ) function may be the forward recursion results. The forward recursion results may be stored in the LIFO/RAM RAM 103.

In block 405, if there is more data in the Edge RAM 102, data from the next available address, in increasing address order, may be fetched from the Edge RAM 102 in block 406 and flow proceeds back to block 402. Otherwise, flow proceeds to block 406.

In block 407, edge data may be fetched from the Edge RAM. For example, edge data may be fetched from the Edge RAM 102, starting at the last available address in the Edge RAM 102.

In block 408, the edge data may be converted back to sign magnitude representation. The edge data in the Edge RAM 102 may be in two's complement notation after having been converted, for example, as in block 305. The edge data, in two's complement notation, may be converted back to sign magnitude representation.

In block 409, the edge data may undergo a circular shift back into check node alignment. The edge data may have undergone a circular shift in the shifter 205, for example, as in 306. The edge data, after being converted back into sign magnitude representation, may, as output e 204, be input to the shifter 205 and be circular shifted back into check node alignment.

In block 410, g( ) may be calculated for the edge data using the g( ) function, and the results of the calculation may used to calculate final check node results. For example, the data output from the shifter 205 may be input into the g( )_sbd calculator 206. The results of the g( ) function may be the backward recursion results.

In block 411, final check node results may be calculated. The backward recursion results may be used in combination with the forward recursion results to calculate the final check node results.

In block 412, the final check node results may be stored back to the Edge RAM 102.

In block 413, if there is more edge data in the Edge RAM 102, data from the next available address, in decreasing address order, may be fetched from the Edge RAM 102 in block 414 and flow proceeds back to block 407. Otherwise, the flow ends.

The accumulator 202 and the g( )_sbd calculator 206 may be specific to the SBD algorithm, and may not be used when the dual mode LDPC decoder uses LBD.

Figure 5:
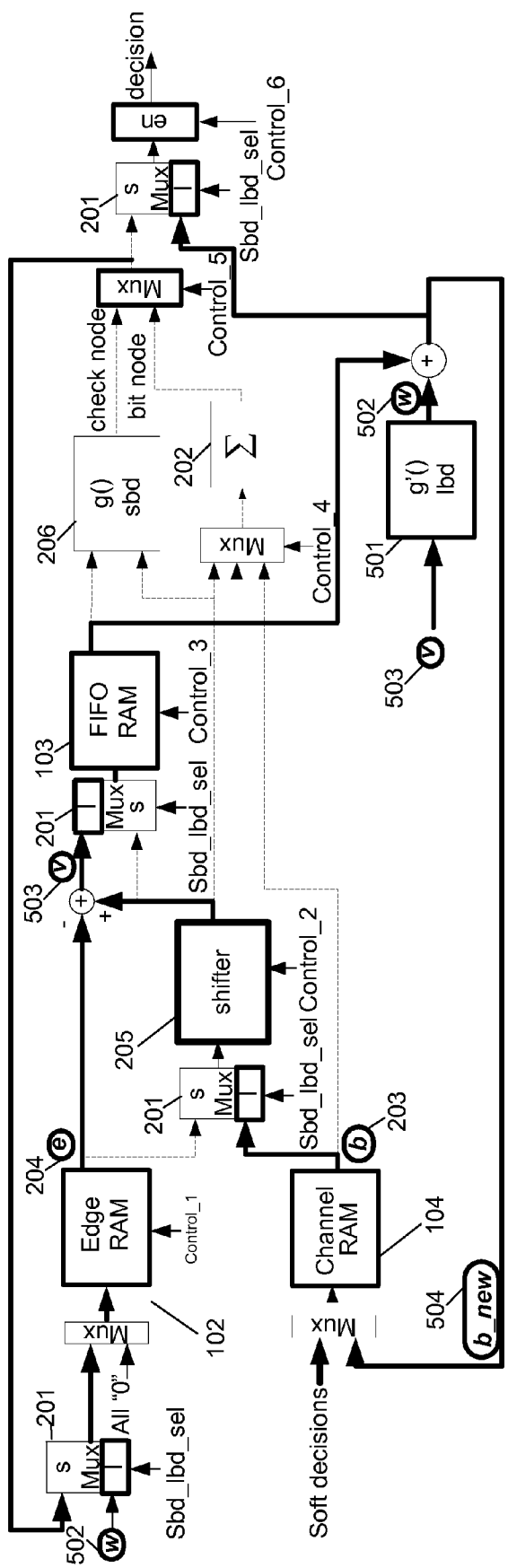
FIG. 5 depicts an exemplary datapath for layered belief propagation decoding.

FIG. 5 depicts an exemplary datapath for layered belief propagation decoding. Selection between the datapath for SBD and the datapath for LBD may be implemented using multiplexers, such as the multiplexers 201. When LBD is selected, the Sbd_lbd_sel line entering the multiplexers 201 may be sent to a value indicating that the multiplexers 201 should connect the LBD input line, as indicated by the "1" in the multiplexers 201, to the output line. This may result in data entering the datapath being processed in accordance with an LBD algorithm, and may leave components of the datapath used for SBD inactive.

Figure 6:
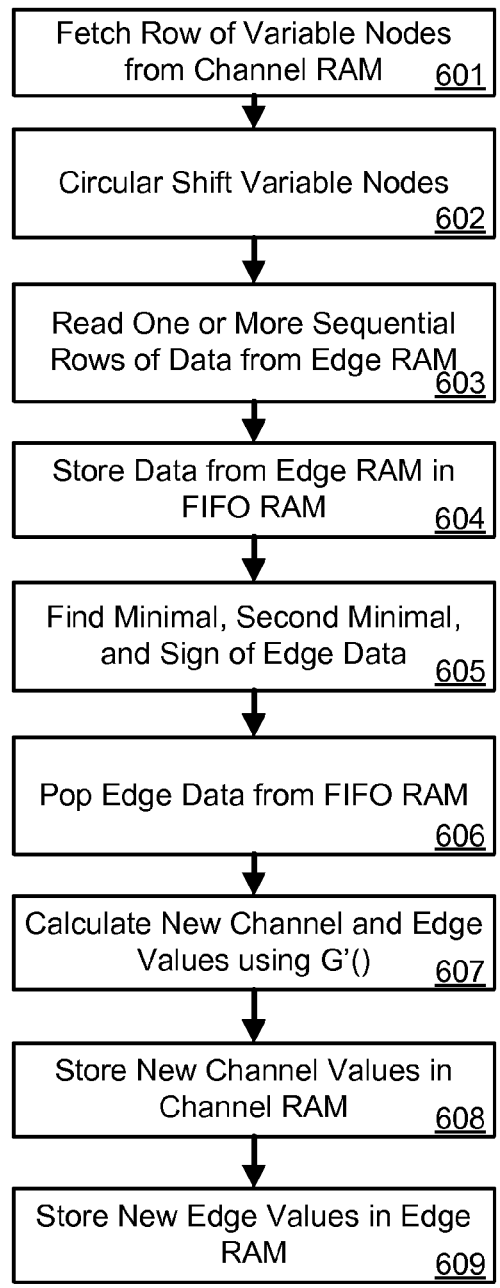
FIG. 6 depicts an exemplary procedure for layered belief propagation decoding.

When a code block is received, the SBD/LBD mode select input to the controller 106 may result in the controller 106 setting the dual mode LDPC decoder 101 to LBD mode, where the LBD controller 112 may control the decoding of the code block. LBD may include a forward sweep and a backward sweep, and may use shared components of the dual mode LDPC decoder 101, and LBD specific components. FIG. 6 depicts an exemplary procedure for layered belief propagation decoding.

In block 601, one row of variable nodes may fetched from the Channel RAM at an address controlled by a microcode. For example, data making up one row of variable nodes may be fetched from the Channel RAM 104, starting at an address indicated by a microcode in the Microcode RAM 107 for the code block being decoded. This may start the forward sweep.

In block 602, the row of variable nodes may be circular shifted by an amount indicated by the microcode. For example, the row of variable nodes fetched from the Channel RAM may be output as output b 203, and input into the shifter 205. The shifter 205 may be controlled by instruction Control_2 from the microcode for the code block being decoded. Control_2 may control the amount by which the shifter 205 circular shifts the row of variable nodes.

In block 603, one or more rows of edge data may be read from the Edge RAM, sequentially. For example, one or more rows of edge data may be read out of the Edge RAM 102, and output as output e 204.

In block 604, the one or more rows of edge data read from the Edge RAM may be stored in the LIFO/FIFO RAM 103. For example, the output e 204 may be input into the LIFO/FIFO RAM 103, which may store the one or more rows of edge data. The LIFO/FIFO RAM 103 may operate in FIFO mode when the dual mode LDPC decoder 101 is operating in LBD mode. Control_3 may control the LIFO buffer of the LIFO/FIFO RAM 103, switching between push, pop, idle and push_pop modes.

In block 605, the minimal, second minimal, and sign of all of the edge data read from the Edge RAM may be found. For example, the minimal may be the smallest value in the edge data read from the Edge RAM 102, and the second minimal may be the second smallest value in the edge data read from the Edge RAM 102. The sign may be the product of sign bits of all of the values in the edge data.

In block 606, edge data may be popped from the LIFO/FIFO RAM 103. For example, because the LIFO/FIFO RAM 103 may operate in FIFO mode when using LBD, the first value placed in the LIFO/FIFO RAM 103 may be the first value popped out of the LIFO/FIFO RAM 103. This may start the backward sweep.

In block 607, new channel and edge values may be calculated using the minimal, second minimal, and sign value, and the value of the edge data popped from the LIFO/FIFO RAM. For example, the minimal, second minimal, and sign value as determined in block 605, may be used with the value of the edge data popped from the LIFO/FIFO RAM 103 to calculate new channel and edge values. The new edge values may be calculated by the g'( )_lbd calculator 501. The g'( )_lbd calculator may calculate the new edge values as the output w 502, using the output v 503. The output v 503 may be the difference between the output b 203 of the Channel RAM 104 and the output e 204 of the Edge RAM 102. The new channel values may be the output b_new 504, which may be the sum of the output w 502 and the output v 503.

In block 608, the new channel values may be written back to the Channel RAM. For example, the values of the output b_new 504 may be written to the Channel RAM 104.

In block 609, the new edge values may be written back to the Edge RAM. For example, the values of the output w 502 may be written to the Edge RAM 102.

The results of the SBD or LBD decoding may be stored in the Decision RAM 109. Control instruction Control_6 may capture the next set of bit decisions into the Decision RAM 109.

Figure 7:
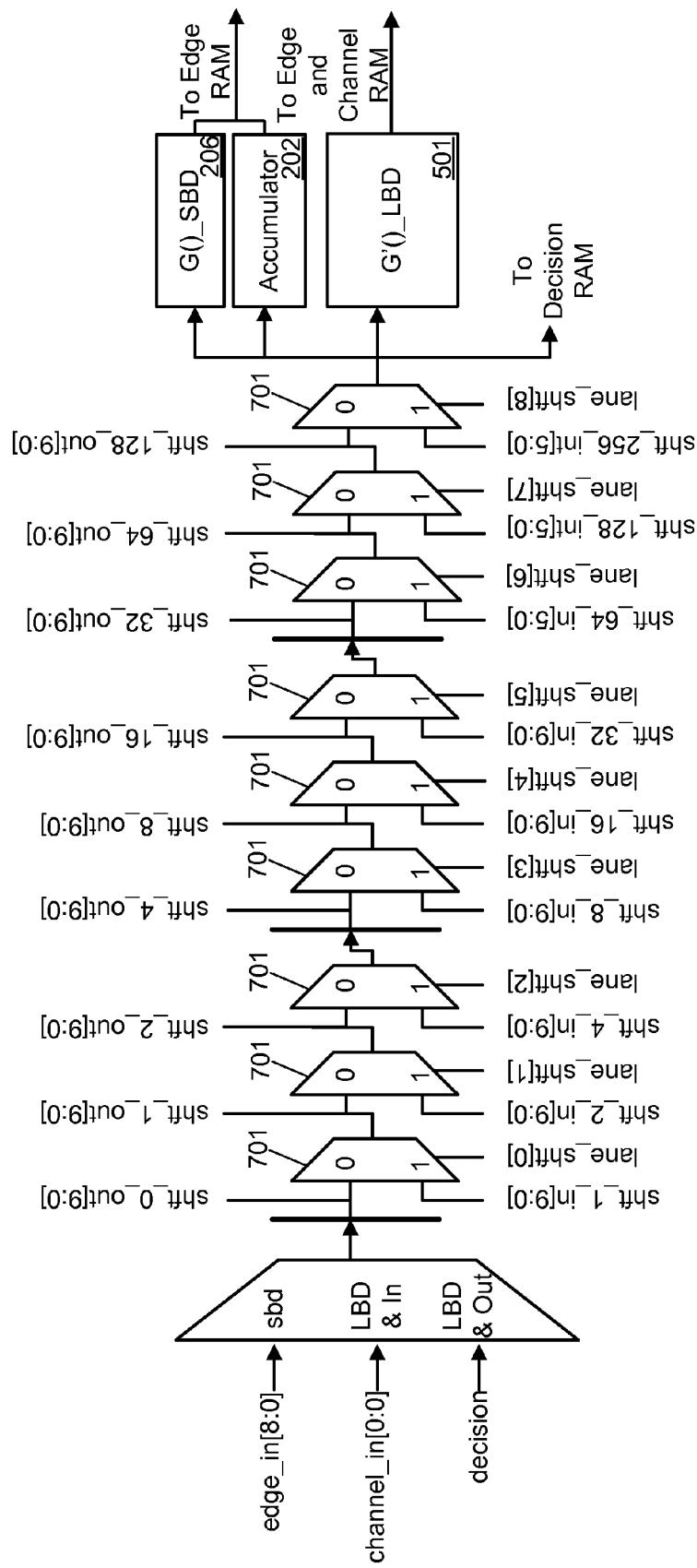
FIG. 7 depicts an exemplary shifter for use with the dual mode LDPC decoder.

FIG. 7 depicts an exemplary shifter for use with the dual mode LDPC decoder. The shifter 205 may be a barrel shifter constructed from a sequence of multiplexers 701. Each datapath in the 360 parallel datapath engines 110 may include one of the shifters 205. The shifters 205 may be interconnected among the 360 datapaths so that data can be rotated among the 360 datapaths within 3 clock cycles. The operation of the shifter 205 may be controlled by the microcode for the code block being decoded.

As used herein, a "computer" or "computer system" may be, for example and without limitation, either alone or in combination, a personal computer (PC), server-based computer, main frame, server, microcomputer, minicomputer, laptop, personal data assistant (PDA), cellular phone, pager, processor, including wireless and/or wire line varieties thereof, and/or any other computerized device capable of configuration for receiving, storing and/or processing data for standalone application and/or over a networked medium or media. Examples of communication media that can be employed include, without limitation, wireless data networks, wire line networks, and/or a variety of networked media.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system. Memory may also include any means for storing software or other instructions including, for example and without limitation, a hard disk, an optical disk, floppy disk, DVD, compact disc, memory stick, ROM (read only memory), RAM (random access memory), PROM (programmable ROM), EEPROM (extended erasable PROM), and/or other like computer-readable media.

In general, computer-readable media may include any medium capable of being a carrier for an electronic signal representative of data stored, communicated or processed in accordance with embodiments of the present invention. Where applicable, method steps described herein may be embodied or executed as instructions stored on a computer-readable medium or media.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these and other elements may be desirable. However, because such elements are well known in the art, and because they do not facilitate a better understanding of the present invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the present invention, a single component may be replaced by multiple components, and multiple components may be replaced by a single component, to provide an element or structure or to perform a given function or functions. Except where such substitution would not be operative to practice certain embodiments of the present invention, such substitution is considered within the scope of the present invention.

The examples presented herein are intended to illustrate potential and specific implementations of the present invention. It can be appreciated that the examples are intended primarily for purposes of illustration of the invention for those skilled in the art. The diagrams depicted herein are provided by way of example. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the following claims.

What is claimed is:

1. An apparatus for a dual mode low density parity check (LDPC) decoder comprising:
    edge random access memory (RAM);
    last-in-first-out/first-in-first-out (LIFO/FIFO) RAM;
    channel RAM; and
    a plurality of parallel data path engines, wherein the datapath engines comprise a standard belief propagation decoding (SBD) datapath and a layered belief propagation decoding (LBD) datapath, wherein the SBD datapath comprises a shifter, an accumulator, a plurality of multiplexers, and a g'( )_sbd calculator, and wherein the LBD datapath comprises the shifter, the plurality of multiplexers, and a g'( )_lbd calculator.

2. The apparatus of claim 1, wherein the LDPC decoder is implemented in one Very-Large-Scale-Integration (VLSI) hardware module.

3. The apparatus of claim 1, wherein the LDPC decoder is configured to perform SBD using the SBD datapath in a first mode, and LBD using the LBD datapath in a second mode.

4. The apparatus of claim 3, wherein in the first mode the plurality of multiplexers activate the accumulator and g( )_sbd calculator of the SBD datapath and deactivate the g'( )_lbd calculator.

5. The apparatus of claim 3, wherein in the second mode the plurality of multiplexer activate the g'( )_lbd calculator and deactivate the accumulator and the g( )sbd calculator.

6. The apparatus of claim 1, further comprising:
    microcode read-only-memory (ROM);
    microcode RAM;

decision RAM; and a controller comprising an SBD controller and an LBD controller.

7. The apparatus of claim 6, wherein the controller selects between a first mode of the LDPC decoder and a second mode of the LDPC decoder, and wherein the LDPC decoder performs SBD using the SBD datapath in the first mode, and LBD using the LBD datapath in the second mode.

8. The apparatus of claim 1, wherein the LDPC decoder is implemented on one application specific integrated circuit (ASIC).

9. The apparatus of claim 1, wherein the LDPC decoder is implemented on one field programmable gate array (FPGA).

10. The apparatus of claim 1, wherein the SBD datapath and the LBD datapath share the edge RAM, the channel RAM, and the LIFO/FIFO RAM.

11. The apparatus of claim 1, wherein the shifter is shared between the SBD datapath and the LBD datapath and is in between inputs and outputs of the dual mode LDPC decoder.

12. The apparatus of claim 1, wherein components of the LBD datapath and the SBD datapath are controlled by microcodes.

13. A method for a dual mode LDPC decoder comprising:

receiving a signal indicating a first mode of operation or a second mode operation; and activating the first mode of operation or the second mode of operation based on the signal, wherein the first mode of operation is standard belief propagation decoding (SBD) and the second mode of operation is layered belief propagation decoding (LBD), and wherein activating the first mode of operation activates an SBD datapath comprising SBD specific components and shared components, and deactivates LBD specific components.

14. The method of claim 13, wherein activating the second mode of operation activates an LBD datapath comprising LBD specific components and shared components and deactivates SBD specific components.

15. The method of claim 14, wherein activating the LBD specific components and the shared components further comprises:

activating a g'( )_lbd calculator;
activating a shifter;
activating an edge RAM;
activating a channel RAM; and
activating a LIFO/FIFO RAM in a FIFO mode.

16. The method of claim 14, further comprising controlling the LBD specific components with microcodes from a microcode RAM.

17. The method of claim 14, wherein activating the SBD specific components and the shared components further comprises:

activating an accumulator;
activating a g( )_sbd calculator;
activating a shifter;
activating an edge RAM;
activating a channel RAM; and
activating a LIFO/FIFO RAM in a LIFO mode.

18. The method of claim 13, further comprising controlling the SBD specific components with microcodes from a microcode RAM.

19. A method for a dual mode LDPC decoder comprising:

receiving a signal indicating a first mode of operation or a second mode operation; and activating the first mode of operation or the second mode of operation based on the signal, wherein the first mode of operation is standard belief propagation decoding (SBD) and the second mode of operation is layered belief propagation decoding (LBD), and wherein activating the first mode of operation or the second mode of operation further comprises applying a signal to a plurality of multiplexers based on the receiving signal indicating the first mode of operation or the second mode of operation.

\* \* \* \* \*